(12) United States Patent
Turowski et al.

(10) Patent No.: US 9,977,250 B2
(45) Date of Patent: May 22, 2018

(54) SELF-REGISTERING LENSES

(71) Applicant: Microsoft Technology Licensing, LLC, Redmond, WA (US)

(72) Inventors: Daniel J. Turowski, Seattle, WA (US); Dane M. Hansen, Marysville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days. days.

(21) Appl. No.: 14/866,136

(22) Filed: Sep. 25, 2015

(65) Prior Publication Data

US 2017/0090205 A1 Mar. 30, 2017

(51) Int. Cl.
| | |
|---|---|
| *G02B 7/02* | (2006.01) |
| *G02B 27/09* | (2006.01) |
| *H01L 27/148* | (2006.01) |
| *H01L 27/146* | (2006.01) |
| *F21V 5/04* | (2006.01) |

(52) U.S. Cl.
CPC ............ *G02B 27/0955* (2013.01); *F21V 5/04* (2013.01); *H01L 27/148* (2013.01); *H01L 27/14627* (2013.01)

(58) Field of Classification Search
CPC ...... G02B 27/0955; G02B 7/00; G02B 7/003; G02B 7/02; G02B 7/022
See application file for complete search history.

(56) References Cited

U.S. PATENT DOCUMENTS

| | | | |
|---|---|---|---|
| 7,471,464 B2 | 12/2008 | Kageyama | |
| 8,405,637 B2 | 3/2013 | Bridger | |
| 8,622,594 B2 * | 1/2014 | Ishio | G02F 1/133606 257/98 |
| 8,688,798 B1 | 4/2014 | Lentini | |
| 2004/0047274 A1 | 3/2004 | Amanai | |
| 2005/0024752 A1 | 2/2005 | Webster | |
| 2005/0179805 A1 * | 8/2005 | Avron | G02B 7/022 348/340 |
| 2011/0026144 A1 | 2/2011 | Shyu et al. | |

FOREIGN PATENT DOCUMENTS

| | | | | |
|---|---|---|---|---|
| JP | 3380949 B2 | | 2/2003 | |
| JP | 3380949 | * | 2/2008 | ............... G02B 7/02 |
| JP | 2009-230984 | * | 3/2008 | ............... F21S 2/00 |
| JP | 2009049239 A | | 3/2009 | |
| JP | 2009230984 A | | 10/2009 | |

OTHER PUBLICATIONS

International Search Report and Written Opinion dated Oct. 20, 2016 from PCT Patent Application No. PCT/US2016/048816, 11 pages.
Second Written Opinion dated Jul. 26, 2017 from PCT Patent Application No. PCT/US2016/048816, 6 pages.
"International Preliminary Report on Patentability Issued in PCT Application No. PCT/US2016/048816", dated Oct. 24, 2017, 7 Pages.

* cited by examiner

*Primary Examiner* — Joseph P Martinez

(74) *Attorney, Agent, or Firm* — Rainier Patents, P.S.

(57) ABSTRACT

The description relates to lenses. One example can include a refraction element defining a lens axis and a registration element extending from an edge of the refraction element in a direction that is generally parallel to the lens axis.

25 Claims, 8 Drawing Sheets

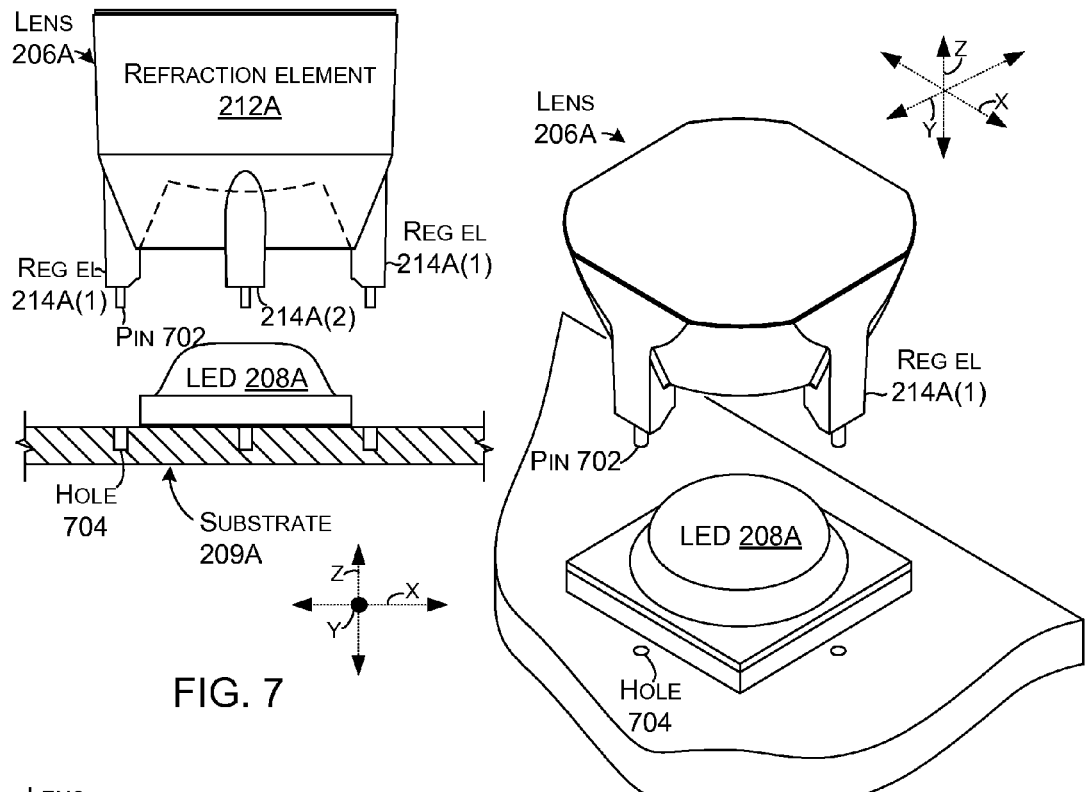
FIG. 7
FIG. 8
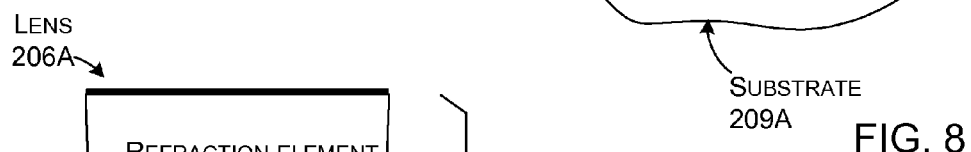
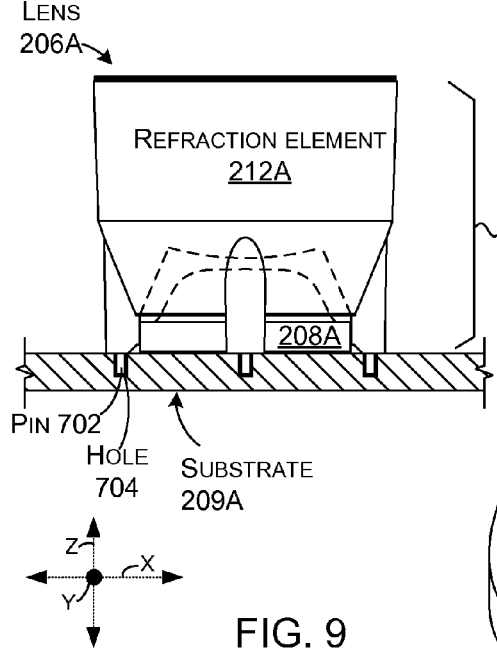
FIG. 9
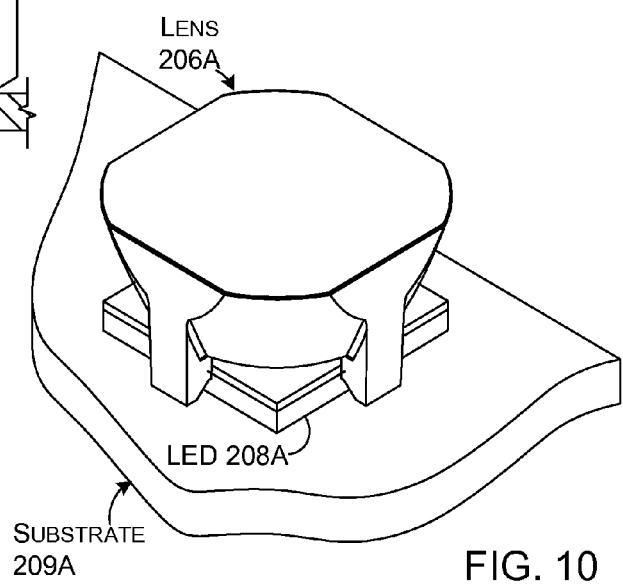
FIG. 10

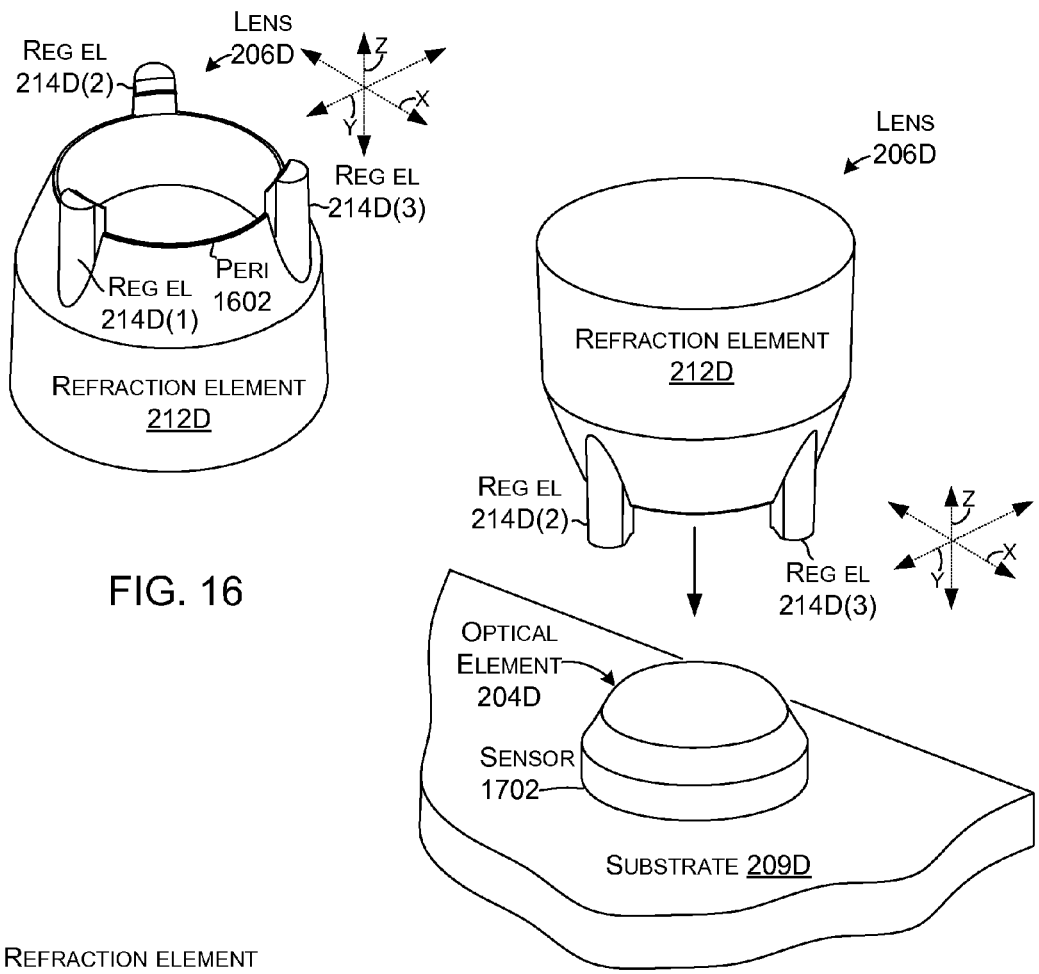
FIG. 16
FIG. 17
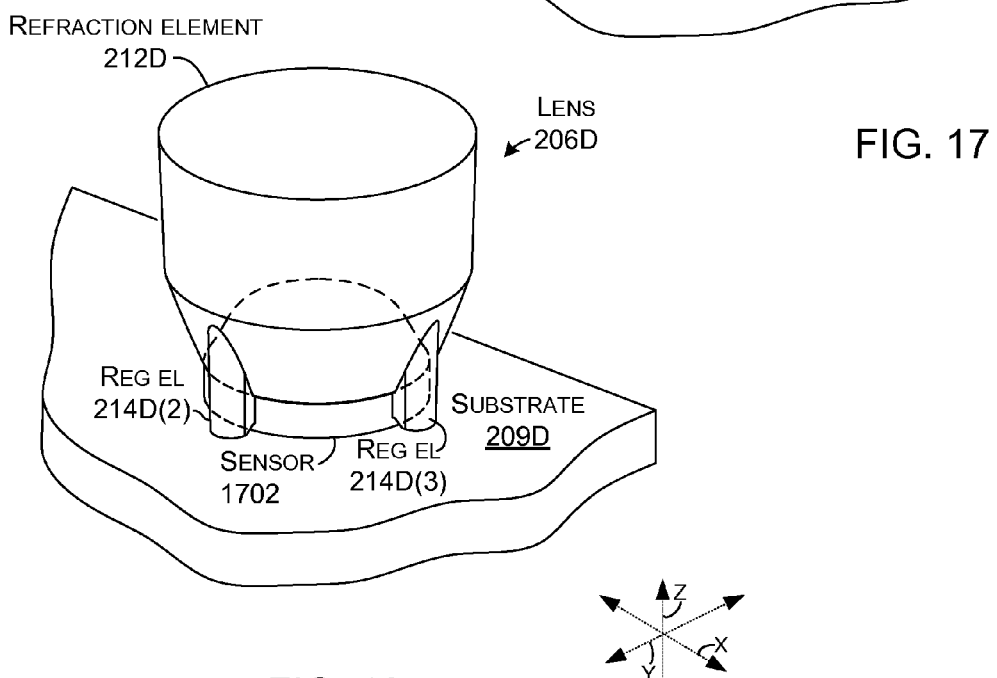
FIG. 18

SELF-REGISTERING LENSES

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the FIG. and associated discussion where the reference number is first introduced.

FIGS. 3, 4, 8, 10-12, and 16-20 are perspective views of example self-registering lenses in accordance with the present concepts.

FIGS. 5-7, 9, 13-15, and 21-22 are elevational views of example self-registering lenses in accordance with the present concepts.

DESCRIPTION

The present concepts relate to lenses that can be employed in various device scenarios. In typical device scenarios, a lens works in cooperation with an optical element, such as a light emitter (e.g., an LED) or a light sensor (e.g. a CCD). Traditionally, a lens holder is employed to position the lens relative to the optical element. This traditional two-part configuration (e.g. dedicated lens and dedicated lens holder) has several advantages. For instance, the two-part configuration can allow decoupling of the optical design from the mechanical/system design since the lens can be selected solely on optical considerations and any mechanical consideration can be handled by the lens holder. Further, with this traditional two-part configuration, mounting design changes are handled by the lens holder and do not affect the optical designs. This aspect can be useful in rapid design cycles. The optical design can be kept very simple so that it is easy to make a high quality optical part (these can be demanding injection molding parts). Further, the mounting requirements may involve very complex geometry, so combining the two parts can be very difficult.

The present concepts reject these traditional advantages and define an integrated device where a single component provides both the optical and mechanical functions. Traditional lens holders require space which can be at a premium in many newer portable devices. Further, besides space required for the lens holder itself, the lens holder requires tolerances on both sides (e.g., between the lens and the lens holder and between the lens holder and the surrounding components). Also, the lens holder may not prioritize precise alignment between the lens and the optical element; typical lens holders align to a printed circuit board (PCB) to which the optical component is mounted, which can be a less precise alignment approach. The present implementations offer a self-aligning or self-registering lens. The self-registering lens can utilize less space than the lens holder and/or can offer more precise alignment between the lens and the optical element. Some implementations of the self-registering lens can employ registration elements that can directly physically engage the optical element to ensure proper alignment.

Figure 1:
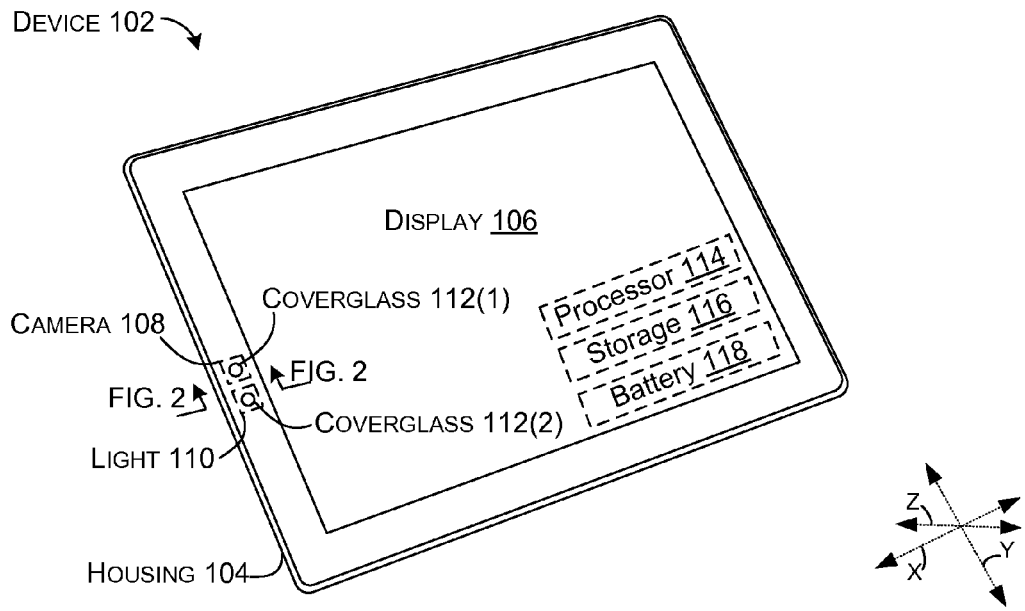
FIG. 1 is a perspective view of an example device that can employ a self-registering lens in accordance with the present concepts.
Figure 2:
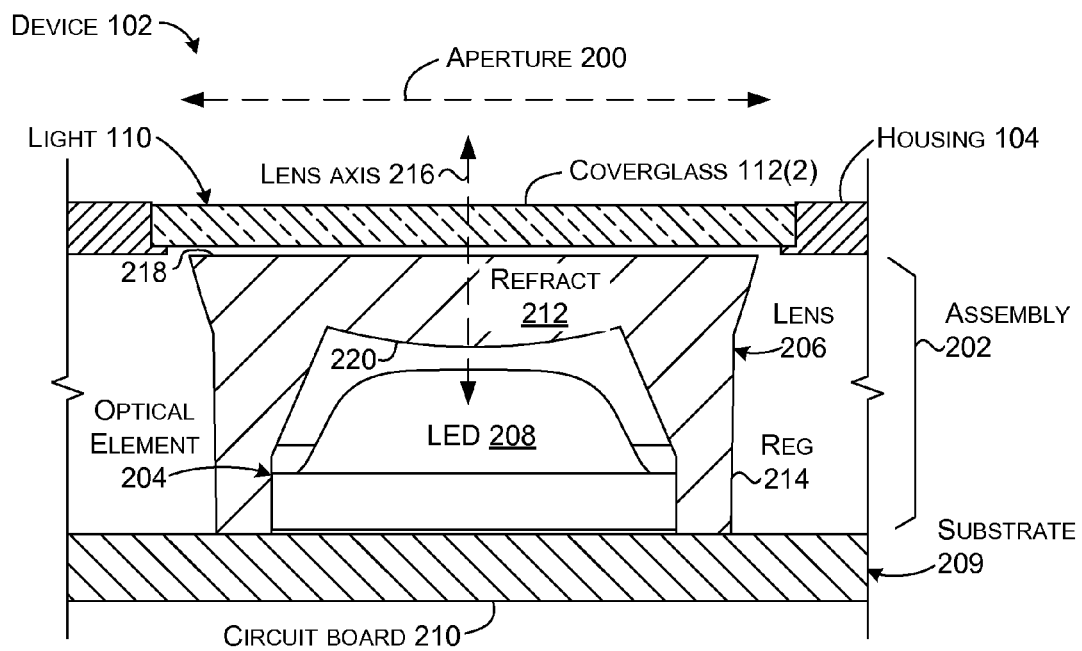
FIG. 2 is a sectional view through a portion of the device of FIG. 1 in accordance with the present concepts.

FIGS. 1 and 2 collectively show a system 100 that employs a first self-aligning lens scenario relative to a first device 102. In this example, the device is manifest as a tablet type device. Other devices can be manifest as smartphones, notebook computers, wearables, peripherals, consumer devices, Internet of Things devices, etc. In this case the device 102 includes a housing 104. Various components can be positioned relative to the housing, such as a display 106, a camera 108, and/or a light 110, which can be protected by cover glasses 112(1) and 112(2) respectively. The camera 108 and the light 110 are shown generally in ghost (dashed line) since they are obscured from view by the housing 104. The camera 108 and light 110 can be electrically coupled to other components, such as a processor 114, storage 116, andor a battery 118 (shown in ghost since they are positioned beneath the display 106). The processor 114 can control and/or receive data from the light 110 and/or the camera 108. The data can be stored on the storage 116.

FIG. 2 shows a sectional view through light 110, coverglass 112(2) and housing 104. A hole or aperture 200 is defined in the housing 104, and the cover glass 112(2) is positioned over the aperture. The light 110 is positioned relative to the aperture 200 (e.g., in light communicating relation). In this case the light 110 includes an assembly 202 positioned below the aperture 200. The assembly 202 can include an optical element 204 and a lens 206 (e.g., a self-registering lens as will be explained below). The optical element 204 is configured to emit or sense light. In this example, the optical element is manifest as a light emitting diode (LED) 208. In this implementation, the LED 208 is secured to a substrate 209 in the form of a circuit board 210. The lens 206 can include a refraction element 212 and a registration element 214. These features are explained in more detail below. Briefly, the refraction element 212 can be configured to focus light and the registration element 214 can be configured to position the lens 206 relative to the optical element 204.

The lens' refraction element 212 can define a lens axis 216. The lens axis can pass through first and second surface 218 and 220 of the refraction element. Generally speaking, lens axis 216 can represent a sum of the light passing through the refraction element 212 either when emitted by LED 208 and passing through the refraction element 212 and the cover glass 112(2) to the ambient environment (e.g., external to the housing 104) and/or from the ambient environment through the cover glass and the refraction element to the optical element 204.

In this case, the registration element 214 can function to align the lens' refraction element 212 with the optical element 204. From one perspective, the registration element can align the lens axis 216 with a center of the optical element 204. This precise alignment can promote efficient use of light emitted by the optical element (e.g., LED 208). As a result, the size of the optical aperture can be reduced/minimized, which can be preferable for industrial design and can enable smaller overall borders of the device 102. The lens 206 can reshape a cone of light (or dispersion pattern) emitted by the LED 208 so that the cone of light can fit through a smaller aperture. Very tight alignment of lens 206 to LED 208 is employed to achieve the desired dispersion pattern. The lens can also allow the light intensity pattern to be customized to be uniform or non-uniform (e.g. greater intensity at the edges or at the center). This can also allow an off-the-shelf LED (typically a very long-lead development time) to be used across multiple systems (e.g., in different devices) with different mechanical constraints. Across systems, the (self-registering) lens 106 can often have the same or similar optical design but with slight differences in size to match the given system's mechanical constraints.

Figure 3:
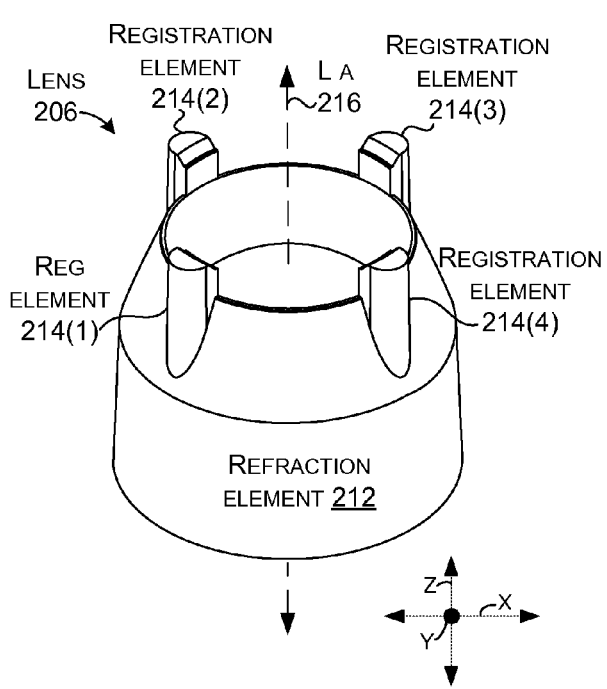
Figure 4:
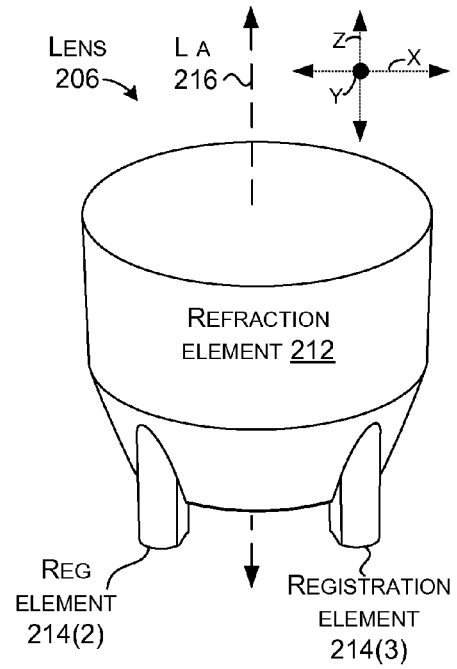

FIGS. 3-4 show perspective views of the lens 206. In this case, the registration element 214 is manifest as multiple registration elements 214(1), 214(2), 214(3), and 214(4). In this implementation, the registration elements 214 are spaced at equal distances around the refraction element 212 and extend generally parallel to the lens axis 216. Stated another way, the multiple registration elements 214 are radially arranged around the lens axis 216.

Figure 5:
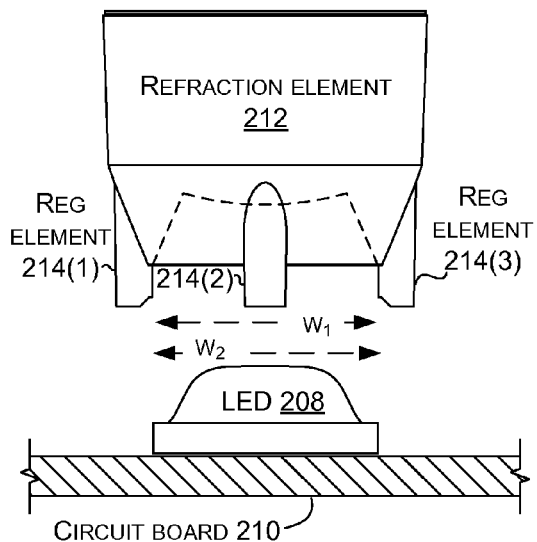
Figure 6:
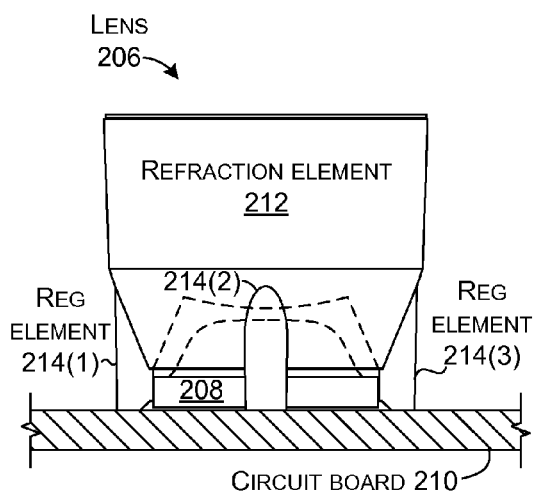
Figure 11:
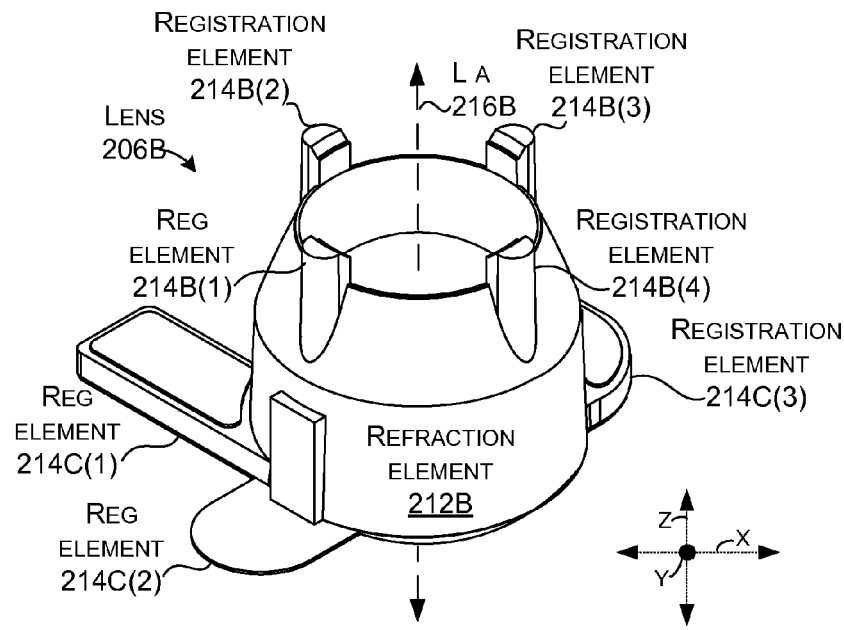
Figure 12:
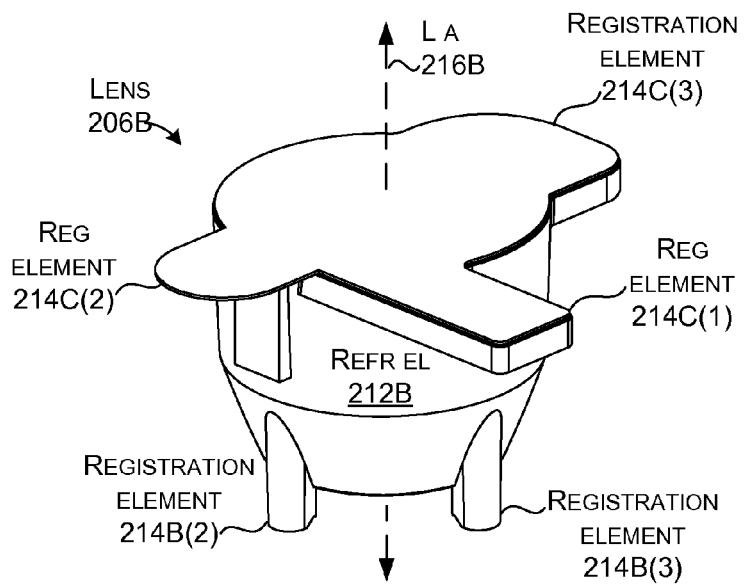

FIGS. 5 and 6 show how the registration elements 214 can work cooperatively to secure the lens 206 relative to the LED 208. For instance, registration elements 214(1) and 214(3) are positioned generally opposing one another and can define a width $w_1$ there between. The width $w_1$ can be equal to or slightly less than a width $w_2$ of the LED 208. When the lens is lowered over the LED, the registration elements 214(1) and 214(3) can be pressed over the LED (e.g., interference fit) to center the LED in the x reference direction relative to the refraction element 212 and hence the lens axis 216. Though registration element 214(4) is occluded in these views by registration element 214(2), registration elements 214(2) and 214(4) can function in a similar manner to center the LED in the y reference direction relative to the refraction element 212 and hence the lens axis 216.

FIGS. 7-10 show another lens 206A that is similar to the lens 206 introduced above relative to FIGS. 2-6. In this implementation, the registration elements 214A include structures for orienting and securing the lens 206A relative to the substrate 209A. In this particular case, the structures are manifest as pins 702 extending from the registration elements. As evidenced in FIGS. 9 and 10, when assembled, the pins 702 align with holes or receptacles 704 formed in the substrate 209A. (Not all of the pins and holes are labelled on the FIGS.) Thus, in this implementation, the registration elements 214A serve to orient the lens (e.g., the refraction element 212A) and the LED 208A as well as orient and hold the lens and the LED relative to the substrate 209A.

Lens 206A can be securely attached within the device (102, FIG. 1) and incapable of movement. The illumination system provided by assembly 202A is a precise optical system, and the slightest distortion or misalignment induced by mechanical stresses can diminish the quality of that system. For that reason, assembly 202A can provide a robust and precise attachment mechanism that can be very carefully implemented to align the lens 206A to the LED 208A. This configuration can provide solid mechanical assembly of the lens relative to the LED. Misalignment diminishes the optical power of the illumination system (e.g., assembly 202A), either reducing the quality and performance of the system, or requiring additional input power to achieve the desired level of performance.

In this implementation, the lens 206A can be oriented to the LED 208A and/or the substrate 209A. Alternatively or additionally, the lens could be positioned relative to an intermediary component that is positioned and oriented relative to the LED.

FIGS. 11-15 introduce another lens 206B. In this case, the lens includes refraction element 212B, a first set of registration elements 214B(1)-214B(4), and a second set of registration elements 214C(1)-214C(3). In this implementation, the first set of registration elements 214B(1)-214B(4) are arranged generally parallel to the lens axis 216B. The second set of registration elements 214C(1)-214C(3) extend generally perpendicular to lens axis 216B. In other configurations both sets of registration elements could extend generally parallel to the lens axis, while in still other implementations, both sets of registration elements could extend generally perpendicular to the lens axis. In other implementations, registration elements can extend at an oblique angle relative to the lens axis.

Figure 13:
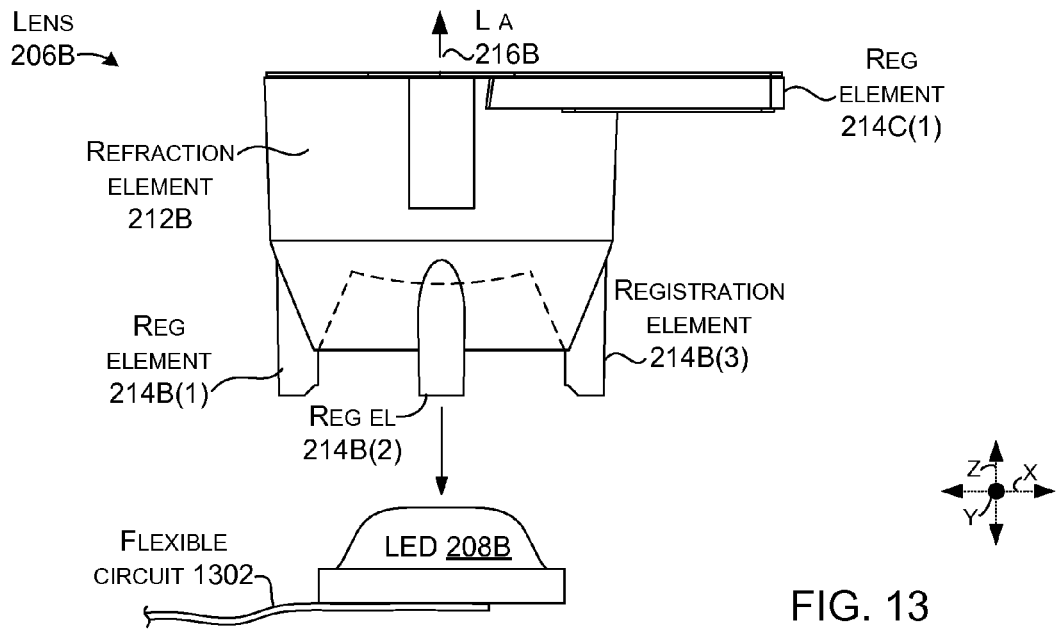
Figure 14:
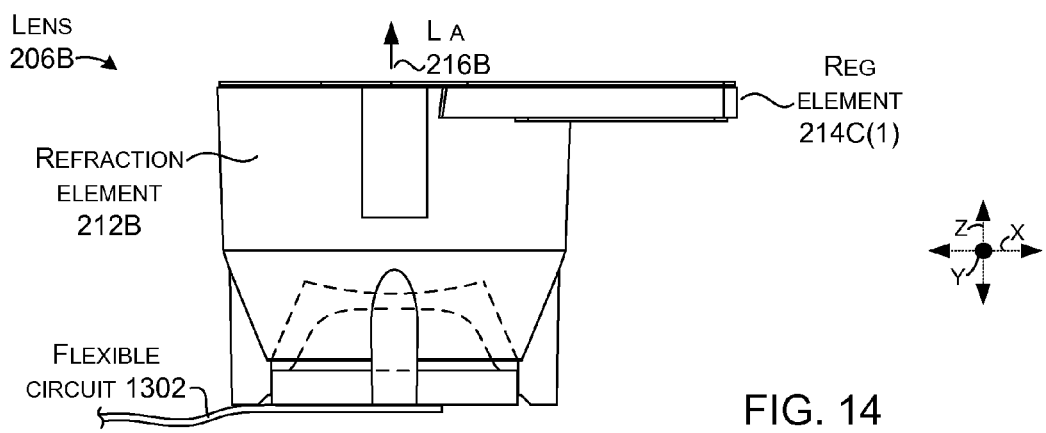
Figure 15:
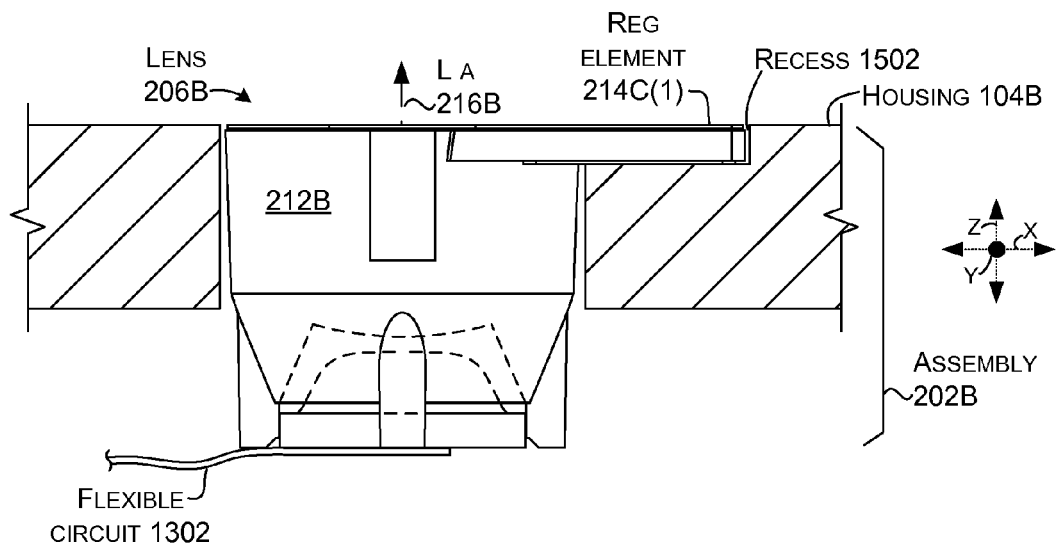
Figure 19:
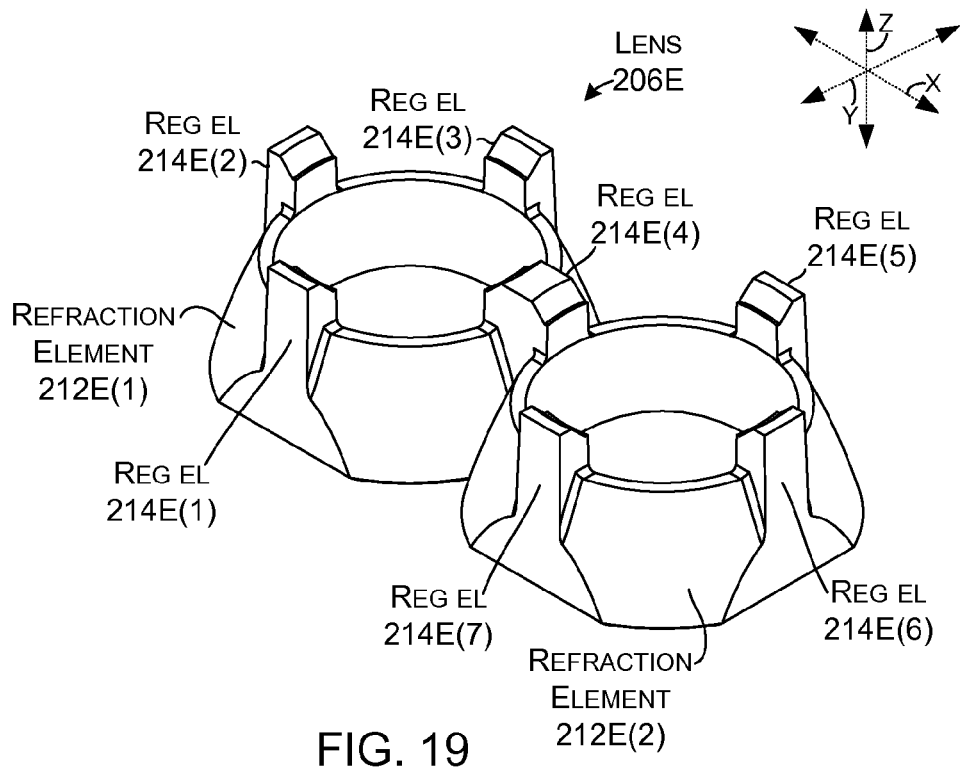
Figure 20:
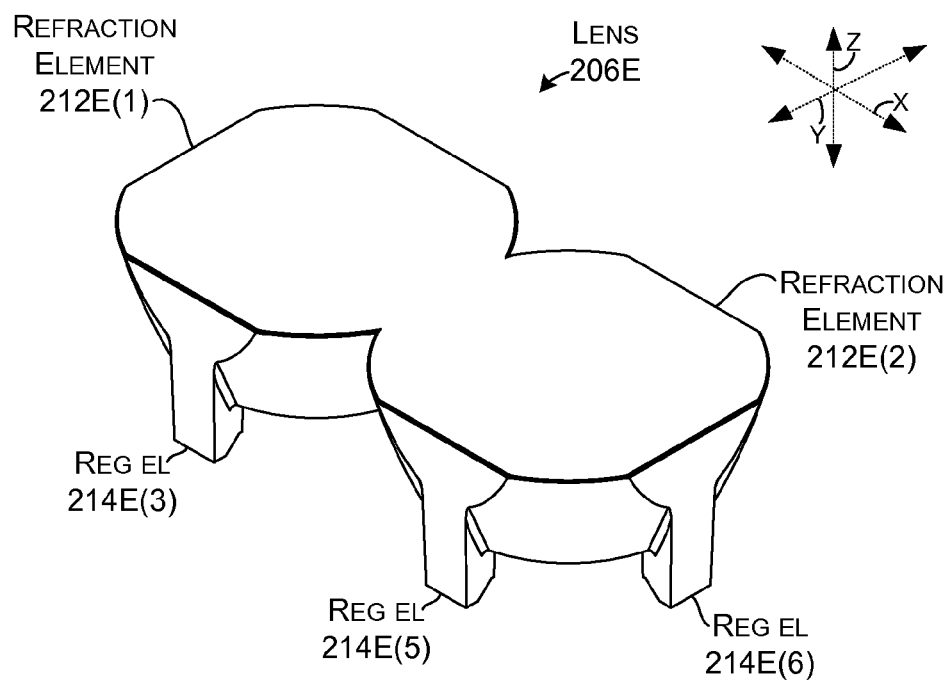
Figure 21:
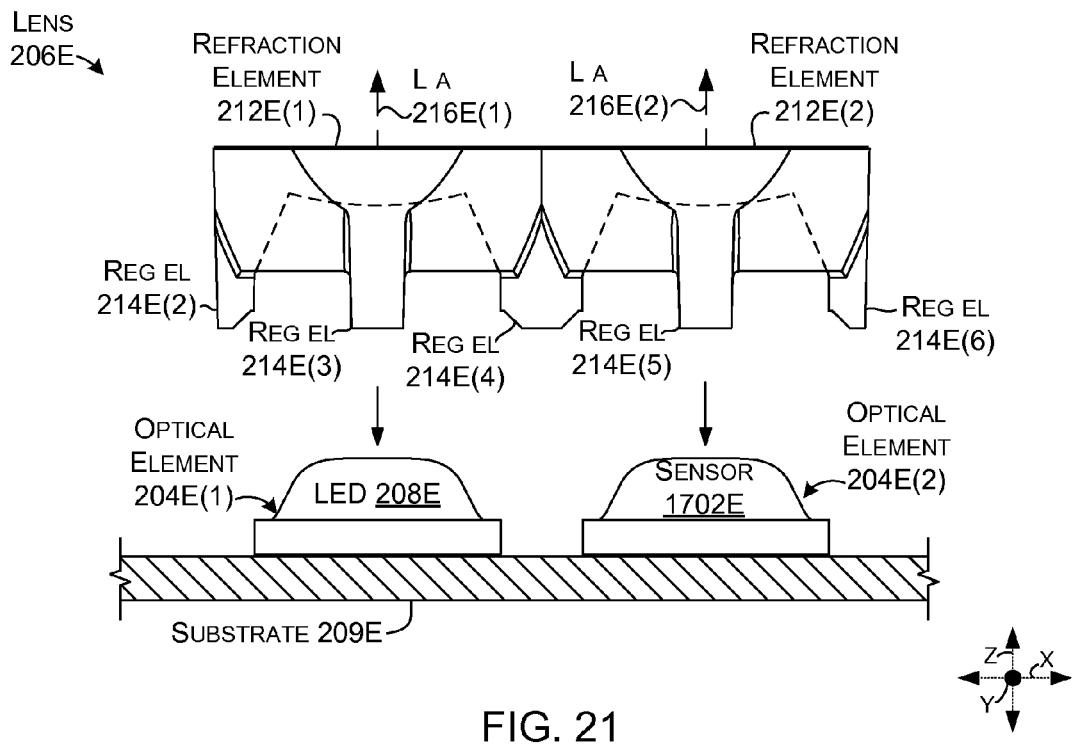
Figure 22:
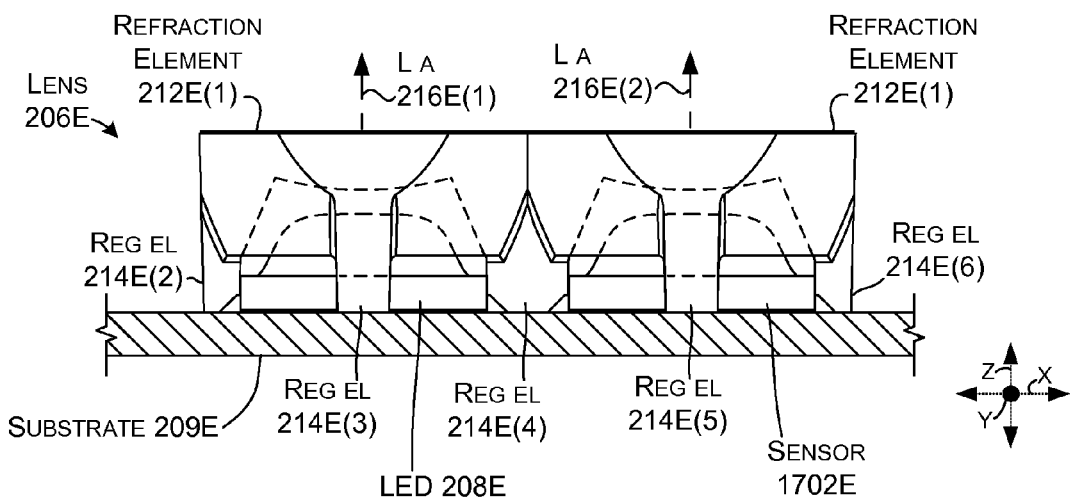

FIGS. 13-15 collectively illustrate orientation functions that can be provided by the first set of registration elements 214B(1)-214B(4) and the second set of registration elements 214C(1)-214C(3) of lens 206B relative to LED 208B and housing 104B. In this case, LED 208B is electrically coupled to a flexible circuit or circuitry 1302 and not to a rigid structure, such as a rigid substrate. Thus, in this implementation, the LED as illustrated in FIG. 13 is free to move and/or rotate.

FIG. 14 shows how the LED 208B can be secured relative to the lens 206B by the first set of registration elements 214B(1)-214B(4). Stated another way, the first set of registration elements can physically secure/connect and orient the LED 208B relative to the lens 206B (e.g., to the lens axis 216B).

FIG. 15 shows how the second set of registration elements 214C(1)-214C(3) (not all of which are visible in this view) can physically secure/connect and orient the lens 206B (and thereby the LED 208B) relative to the housing 104B. For instance, individual registration elements 214C of the second set can inter-relate with recesses or other features in the housing 104B. For example, registration element 214C(1) can fit in recess 1502 in housing 104B. Stated another way, the two sets of registration elements 214B(1)-214B(4) and 214C(1)-214C(3) can cooperatively orient and physically secure the LED 208B to the lens 206B in alignment with the lens axis 216B and then orient and secure the lens 206B and indirectly the LED 208B relative to the housing 104B (e.g. to the aperture 200 in the housing of FIG. 2). From still another perspective, the first set of registration elements 214B can orient and secure the lens 206B and the LED 208B as assembly 202B which can then be oriented and secured to the housing 104B (or another part of the device) by the second set of registration elements 214C.

FIGS. 16-18 collectively show another implementation involving another lens 206D. In this case, multiple registration elements 214D(1)-214D(3) (in this case three) are radially arranged around an edge or perimeter 1602 of refraction element 212D. In this example, the three registration elements 214D(1)-214D(3) are spaced at equal distances around the perimeter (e.g., 120 degrees apart). As evidenced in FIG. 17, optical element 204D is manifest as a sensor 1702, such as a charge coupled device (CCD). In this example, the sensor 1702 is circular when viewed along the z reference axis. As evidenced in FIGS. 17 and 18, the three registration elements 214D(1)-214D(3) can align (e.g., center) the sensor 1702 relative to the refraction element 212D.

FIGS. 19-22 collectively show another lens implementation. In this example, the lens 206E includes multiple refraction elements 212E (in this case two, but the concepts could be applied to more than two). As evidenced in FIGS. 21 and 22, the two refraction elements 212E(1) and 212E(2) can have parallel lens axes 216E(1) and 216E(2). The two refraction elements 212E(1) and 212E(2) are bordered by registration elements 214E(1)-214E(7) (not all of which are visible in each FIG.). The registration elements 214E(1)-214E(7) can secure and orient the lens 206E relative to the optical elements 204E(1) and 204E(2). From one perspective, the registration elements 214E(1)-214E(7) can orient the optical elements directly beneath and in line with the refractive elements such that a center of the optical elements is aligned with the lens axes. As such, the lens can ensure that the lens axes 216E(1) and 216E(2) of the two refraction elements 212E(1) and 212E(2) are parallel to one another. The registration elements can orient and secure the optical elements 204E(1) and 204E(2) relative to refractive elements 212E(1) and 212E(2) (e.g., centered and oriented relative to the lens axes 216E(1) and 216E(2) respectively). Thus, this lens configuration with two refraction elements and registration elements for orienting the optical elements relative to the refraction elements can provide a more precise alignment and cooperative functioning of the optical elements than traditional configurations. For instance, in this case, optical element 204E(1) is manifest as LED 208E and optical element 204E(2) is manifest as sensor 1702E, such as a light sensor. Thus, light emitted by the LED can be effectively transmitted out of refraction element 212E(1) along lens axis 216E(1) and returning light can travel along lens axis 216E(2) of refraction element 212E(2) into sensor 1702E. For instance, in one case, lens 206E could be implemented to accomplish the adjacent light and camera of FIG. 1. The illustrated lens configuration lends itself to other implementation scenarios. For instance, the two optical elements 204E might be camera sensors that with the precise alignment offered by lens 206E can work cooperatively to provide 3D images. Whatever optical elements are employed, the lens can provide axial alignment of the lens and the optical elements.

The lenses 206 described in the various implementations above can be formed in various ways and from various materials. For instance, the lenses could be formed from glass which is chemically and/or mechanically processed to achieve the specified shape. Molding can provide another technique. For instance, polymers or composites can be placed in a mold of the lens shape and cured to form the lens.

ADDITIONAL EXAMPLES

Various device examples are described above. Additional examples are described below. One example is manifest as a lens that includes a refraction element defining a lens axis and a registration element extending from an edge of the refraction element in a direction that is generally parallel to the lens axis.

Another example can include any combination of the above and/or below examples where the registration element comprises a single registration element.

Another example can include any combination of the above and/or below examples where the registration element comprises multiple registration elements.

Another example can include any combination of the above and/or below examples where the multiple registration elements are radially arranged around the refraction element.

Another example can include any combination of the above and/or below examples where the multiple registration elements are elongated and extend generally parallel to the lens axis.

Another example can include any combination of the above and/or below examples where the refraction element includes first and second surfaces through which the lens axis passes.

Another example can include any combination of the above and/or below examples where the registration element comprises multiple registration elements.

Another example can include any combination of the above and/or below examples where all of the multiple registration elements extend from either of the first and second surfaces.

Another example can include any combination of the above and/or below examples where a first set of the multiple registration elements extend from the first surface and a second set of the multiple registration elements extend from the second surface.

Another example is manifest as an assembly. The assembly can include an optical element configured to emit or sense light and a lens comprising a refraction element and a registration element. The refraction element configured to focus the light and the registration element configured to position the lens relative to the optical element.

Another example can include any combination of the above and/or below examples where the registration element comprises multiple registration elements that are equally spaced around a perimeter of the optical element.

Another example can include any combination of the above and/or below examples where the multiple registration elements physically engage the optical element.

Another example can include any combination of the above and/or below examples where the multiple registration elements physically engage the optical element and a substrate to which the optical element is secured.

Another example can include any combination of the above and/or below examples where the lens defines a lens axis and wherein the registration element extends parallel to the lens axis, perpendicular to the lens axis, or at an oblique angle relative to the lens axis.

Another example can be manifest as a device that includes a housing, an optical element, and a lens. The housing can define an aperture. The optical element can be configured to emit or sense light. The lens can be interposed in light transmitting relation between the aperture and the optical element. The lens can comprise a registration element configured to position the lens relative to the optical element.

Another example can include any combination of the above and/or below examples where the lens further comprises another registration element configured to position the lens relative to the aperture.

Another example can include any combination of the above and/or below examples further including a cover glass positioned in the aperture and wherein the another registration element positions the lens relative to the cover glass.

Another example can include any combination of the above and/or below examples where the another registration element is fastened to the housing proximate to the aperture.

Another example can include any combination of the above and/or below examples where the another registration element comprises multiple pins positioned in receptacles in the housing around the aperture.

Another example can include any combination of the above and/or below examples where the device further comprises a circuit board.

Another example can include any combination of the above and/or below examples where the optical element is secured to the circuit board and the registration element is secured to the optical element.

Another example can include any combination of the above and/or below examples where the registration element is secured to the optical element and to the circuit board.

Another example can include any combination of the above and/or below examples where the optical element is electronically coupled to flexible circuitry that is electrically coupled to a processor, and where the registration element physically secures the optical element to the lens.

Another example can include any combination of the above and/or below examples where the optical element comprises a light emitter or a light sensor.

CONCLUSION

The described implementations relate to a lens that can register itself relative to an underlying optical element to provide precise axial alignment of the lens to the optical element. It is common practice to use a lens holder with locating pins (a second part) assembled with the lens element(s) to achieve a tight tolerance loop. Some devices are spaced constrained and do not have room for a lens holder. The present implementations provide a self-aligning or self-registering lens that can fit closely around the optical element (in some cases with an interference fit).

Integrating the locating features (e.g., the registration elements) onto the lens can result in an even tighter tolerance loop. Further, integrating the registration elements into the lens can achieve excellent alignment of the lens(es) to board-mounted LEDs, optical sensors, and/or other optical elements. The integrated lens can also reduce the number of parts required for the optical system by avoiding a separate lens holder. The integrated lens can also allow for solid mechanical assembly of the lens to the optical component. The integrated lens can also reduce/minimize the size of an optical aperture, which can be preferred for industrial design and can enable smaller overall borders.

As mentioned above, the tolerance loop is reduced to the tolerances of the optical element itself (which will be a constant factor in any design) and the tolerances of the integrated lens. Because the integrated lens will often be manufactured by an optical molder, which traditionally has excellent tolerances required for optical parts, the mechanical locating tolerances will also benefit and be excellent. The net result is that axial misalignment is quite low compared to other approaches. As mentioned, standard designs use a lens holder to align the element to the system. By integrating the alignment features into the lens element, additional parts are removed while maintaining or increasing alignment accuracy. This can save on cost and assembly time as well as the above mentioned smaller device dimensions.

Although techniques, methods, devices, systems, etc., pertaining to self-registering lenses are described in language specific to structural features and/or methodological acts, it is to be understood that the subject matter defined in the appended claims is not necessarily limited to the specific features or acts described. Rather, the specific features and acts are disclosed as exemplary forms of implementing the claimed methods, devices, systems, etc.

The invention claimed is:

1. A device, comprising:
   a housing;
   a lens;
   a circuit; and
   an optical element secured to the circuit, the optical element being configured to emit or sense light,
   the lens comprising:
      a refraction element defining a lens axis;
      a first registration element extending from the refraction element in a first direction that is generally parallel to the lens axis, the first registration element of the lens securing the lens directly to the circuit; and
      a second registration element extending from the refraction element in a second direction that is generally perpendicular to the lens axis, the second registration element of the lens securing the lens to the housing.

2. The device of claim 1, wherein the second registration element of the lens comprises multiple second registration elements extending from the refraction element generally perpendicular to the lens axis.

3. The device of claim 2, wherein the first registration element of the lens comprises multiple first registration elements.

4. The device of claim 3, wherein the multiple first registration elements of the lens are radially arranged around the refraction element.

5. The device of claim 3, wherein the multiple first registration elements of the lens are elongated and extend generally parallel to the lens axis.

6. The device of claim 1, wherein the refraction element of the lens includes first and second surfaces through which the lens axis passes.

7. The device of claim 2, wherein the housing comprises multiple recesses and each of the second registration elements inter-relates with a corresponding recess in the housing.

8. The device of claim 7, wherein the circuit is flexible.

9. The device of claim 1, wherein the first registration element extends from a first surface of the lens and the second registration element extends from a second surface of the lens.

10. A device, comprising:
    a housing;
    a flexible circuit;
    an optical element secured to the flexible circuit, the optical element being configured to emit or sense light; and,
    a lens comprising:
       a refraction element configured to focus the light;
       a first registration element configured to position the lens relative to the optical element and to secure the lens to the flexible circuit; and
       a second registration element configured to secure the lens to the housing.

11. The device of claim 10, wherein the first registration element of the lens comprises multiple first registration elements that are equally spaced around a perimeter of the optical element.

12. The device of claim 11, wherein the multiple first registration elements of the lens physically engage the optical element.

13. The device of claim 10, wherein the lens defines a lens axis, the first registration element extends from the refraction element in a first direction that is generally parallel to the lens axis, and the second registration element extends from the refraction element in a second direction that is generally perpendicular to the lens axis.

14. The device of claim 13, wherein the housing comprises a recess and the second registration element fits in the recess.

15. A device, comprising:
    a housing defining an aperture and having a recess;
    a circuit;
    an optical element coupled to the circuit and configured to emit or sense light; and,
    a lens interposed in light transmitting relation between the aperture and the optical element, the lens comprising:

a first registration element configured to position the lens relative to the optical element and to secure the lens directly to the circuit; and a second registration element configured to inter-relate with the recess and secure the lens to the housing.

16. The device of claim 15, wherein the first registration element of the lens is configured to position the lens relative to the aperture.

17. The device of claim 16, further comprising a cover glass positioned in the aperture and wherein the first registration element of the lens positions the lens relative to the cover glass.

18. The device of claim 15, wherein the circuit comprises a flexible circuit.

19. The device of claim 18, wherein the optical element is electronically coupled to the flexible circuit.

20. The device of claim 19, further comprising a processor that is electronically coupled to the flexible circuit.

21. The device of claim 20, the optical element comprising a light emitting diode.

22. The device of claim 20, the optical element comprising a charge-coupled device.

23. The device of claim 22, manifest as a tablet type device or a smartphone.

24. The device of claim 23, lacking a lens holder.

25. The device of claim 15, lacking a lens holder.

* * * * *